United States Patent
Chen et al.

(10) Patent No.: US 8,434,041 B2
(45) Date of Patent: Apr. 30, 2013

(54) INCREASING DIELECTRIC STRENGTH BY OPTIMIZING DUMMY METAL DISTRIBUTION

(75) Inventors: Hsien-Wei Chen, Sinying (TW); Tzuan-Horng Liu, Longtan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 240 days.

(21) Appl. No.: 12/987,630

(22) Filed: Jan. 10, 2011

(65) Prior Publication Data

US 2012/0180018 A1 Jul. 12, 2012

(51) Int. Cl.
*G06F 17/50* (2006.01)
(52) U.S. Cl.
USPC ............. 716/110; 716/55; 716/119; 716/130; 716/132
(58) Field of Classification Search .......... 438/106–108, 438/118–119, 597, 612–614, 618, 622; 716/50–56, 716/110–111, 119, 122, 130, 132
See application file for complete search history.

(56) References Cited

U.S. PATENT DOCUMENTS 7,276,435 B1 * 10/2007 Pozder et al. ............... 438/597
2011/0083115 A1 * 4/2011 Liu et al. .................... 716/118

* cited by examiner

*Primary Examiner* — Paul Dinh
(74) *Attorney, Agent, or Firm* — Slater & Matsil, L.L.P.

(57) ABSTRACT

A method includes providing a wafer representation including a metal layer and a plurality of bump pads over the metal layer, wherein the metal layer includes directly-under-bump-pad regions. A solid metal pattern is inserted into the metal layer, wherein the solid metal pattern includes first parts in the directly-under-bump-pad regions and second parts outside the directly-under-bump-pad regions. Portions of the second parts of the solid metal pattern are removed, wherein substantially no portions of the first parts of the solid metal pattern are removed. The remaining portions of the solid metal pattern not removed during the step of removing form dummy metal patterns. The dummy metal patterns and the plurality of bump pads are implemented in a semiconductor wafer.

20 Claims, 8 Drawing Sheets

INCREASING DIELECTRIC STRENGTH BY OPTIMIZING DUMMY METAL DISTRIBUTION

BACKGROUND

Dummy metals and dummy vias were used in integrated circuits, for example, for reducing micro-loading effects in the manufacturing processes. In existing methodology for inserting dummy metals and dummy vias, metal lines and metal vias are laid out first, and the dummy metals and dummy vias are inserted to chip areas that are not used by the metal lines and metal vias. The existing insertion methodology may suffer from low insertion efficiency.

Accordingly, there is a need for an improved method to provide insertion methodology with high insertion efficiency.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure. A method for inserting dummy metals and dummy vias is provided in accordance with an embodiment. The intermediate stages of various embodiments are illustrated. Throughout the various views and illustrative embodiments, like reference numbers are used to designate like elements.

Figure 1:
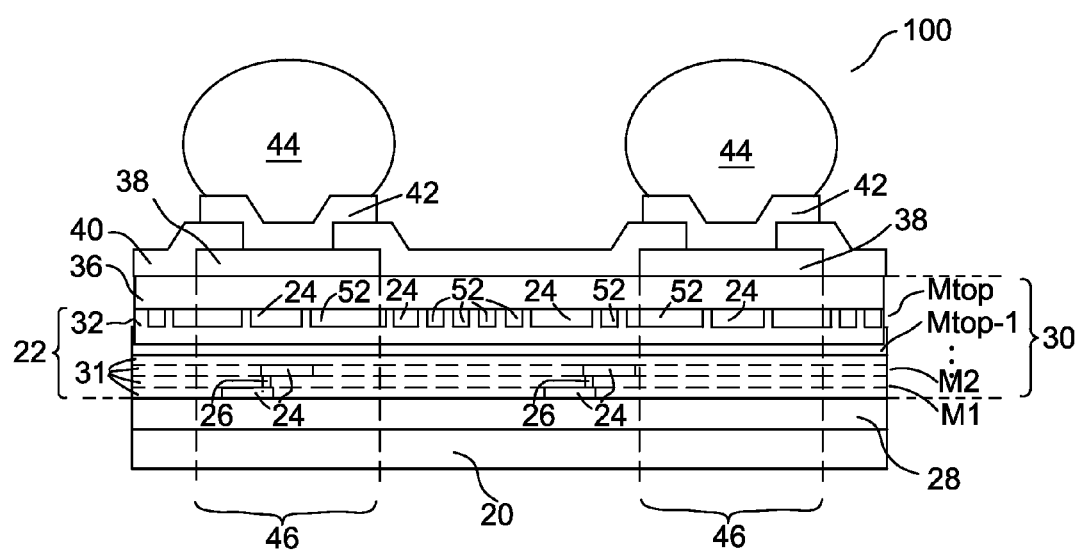
FIG. 1 illustrates a cross-sectional view of a die in accordance with an embodiment.

Referring to FIG. 1, a cross-sectional view of a portion of semiconductor wafer 100 is provided. Semiconductor wafer 100 may include active devices such as transistors (not shown) formed at a surface of semiconductor substrate 20. Interconnect structure 22, which includes metal lines 24 and vias 26 formed therein and electrically coupled to the semiconductor devices, is formed at the surface of semiconductor substrate 20. Metal lines 24 and vias 26 may be formed of copper or copper alloys, and may be formed using damascene processes. Interconnect structure 22 may include inter-layer dielectric (ILD) 28 and inter-metal dielectrics (IMDs) 30. Metal lines 24 and vias 26 are formed and embedded in inter-layer dielectric (ILD) 28 and inter-metal dielectrics (IMDs) 30.

IMDs 30 may include a plurality of dielectric layers 31 and a top dielectric layer 32, wherein the metal layers in dielectric layers 31 are referred to as metal layers M1 through Mtop-1. The metal layer in top dielectric layer 32 is referred to as Mtop, wherein integer "top" may represent 9 or a greater or a smaller integer. In an embodiment, metal lines 24 and vias 26 in metal layers M1 through Mtop-1 are formed of copper or copper alloys. Furthermore, dielectric layers 31 may be low-k dielectric layers having k values lower than about 3.0 or 2.5, for example. Metal layer Mtop may be formed of copper or copper alloys, or alternatively be formed of aluminum, aluminum copper, or the like. Top dielectric layer 32 may be formed of a low-k dielectric material or other non-low-k (with k values greater than 3.8) dielectric materials such as un-doped silicate glass (USG).

One or more passivation layer may be formed over interconnect structure 22. In the illustrated embodiment, passivation layer 36 and passivation layer 40 are formed. Bump pad 38 is formed over passivation layer 36. Bump pad 38 may comprise aluminum (Al) or aluminum copper (AlCu), and may also include other metals such as silver (Ag), gold (Au), nickel (Ni), tungsten (W), and the like. Bump pad 38 may be electrically coupled to the semiconductor devices through the underlying interconnection structure 22 and the metal connections (not shown) in passivation layer 36. Passivation layer 40 may comprise a portion covering edge portions of bump pad 38, and portions at a same level as bump pad 38. Passivation layers 36 and 40 may be formed of polyimide or other known dielectric materials such as silicon oxide, silicon nitride, and multi-layers thereof.

Under bump metallurgy (UBM) 42 is formed on, and electrically coupled to, bump pad 38. UBM 42 may include a copper layer and a titanium layer (not shown). Metal bumps 44 are formed over UBM 42. Metal bumps 44 may be formed of a non-reflowable material and may comprise, for example, copper, nickel, palladium, or the like. Alternatively, metal bumps 44 are solder bumps.

Throughout the description, the regions that are directly under, and vertically overlapping, bump pads 38 are referred to as directly-under-bump-pad regions, as marked as regions 46 (FIG. 1). In an embodiment, the metal features in directly-under-bump-pad regions 46 may have a pattern density as high as possible, providing design rules for laying out the metal features are not violated. The metal features in directly-under-bump-pad regions 46 include metal lines 24 and vias 26 in interconnection 22 and dummy metals, such as dummy patterns 52. Directly-under-bump-pad regions 46 extend through all of dielectric layers 31 and 32, and into passivation layer 36. Accordingly, each of metal layers M1 through Mtop includes directly-under-bump-pad regions and regions that are outside any of the directly-under-bump-pad regions.

Figure 2:
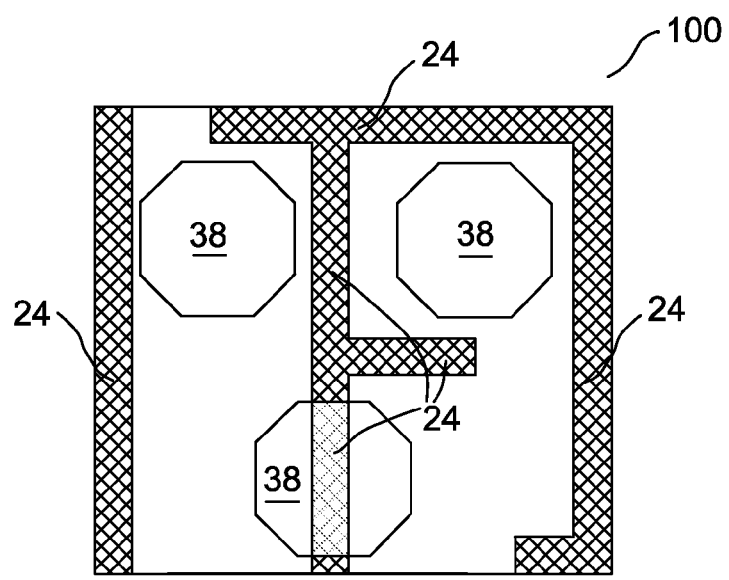
FIGS. 2 through 4 are top views of intermediate stages in the insertion of dummy metal patterns in accordance with an embodiment, wherein a blanket dummy metal pattern is inserted first, and portions of the blanket dummy metal pattern are removed from outside the directly-under-bump-pad regions.
Figure 3:
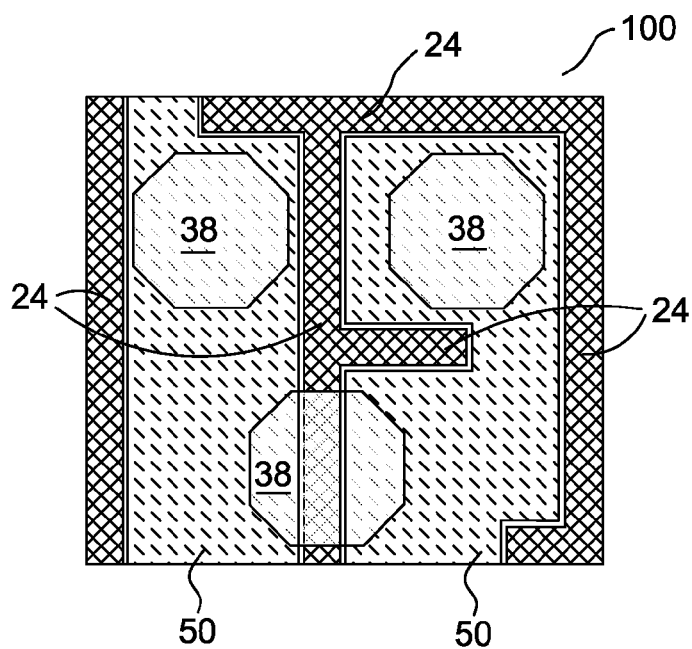
Figure 4:
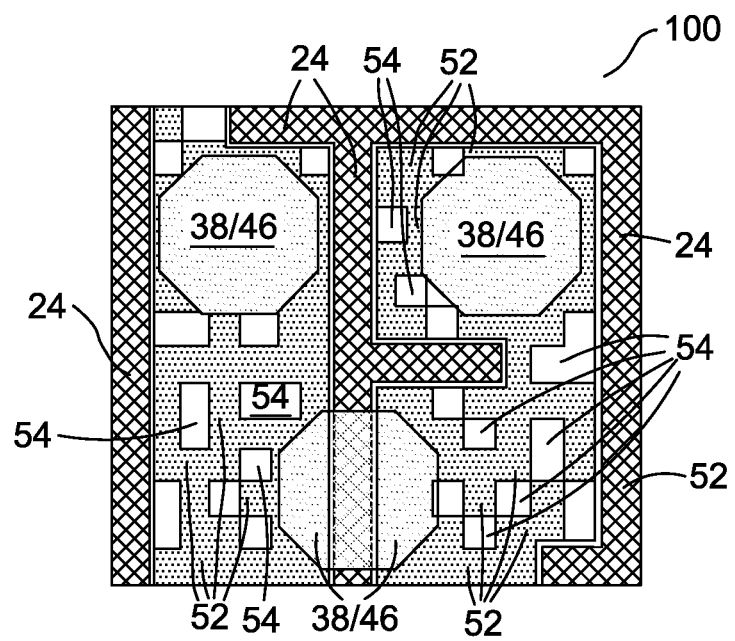

FIGS. 2 through 4 illustrate top views in the intermediate stages in laying out dummy patterns in one of metal layers (metal layer Mi, with integer i being one of integers 1 through "top") in accordance with an embodiment. Referring to FIG. 2, a top view of semiconductor wafer 100 and bump pads 38 in semiconductor wafer 100 are illustrated. It is noted that throughout FIGS. 2 through 13, the illustrated semiconductor wafer 100, bump pads 38, metal lines 24, dummy metal patterns 52 and 152, and the like are representations of the features in a physical wafer shown in FIG. 1. At the time the steps shown in FIGS. 2 through 13 are performed during the laying out stages, the representations have not been implemented and fabricated in physical semiconductor wafers yet. Accordingly, throughout the description, wafer 100 is also referred to as a wafer representation. The features, however, will be implemented in physical wafers in later subsequent manufacturing steps.

Referring to FIG. 3, solid metal patterns 50 are laid out (inserted) in metal layer Mi, in which metal lines 24 are laid out before the insertion of solid metal pattern 50. Solid metal patterns 50 may not be connected to any of metal lines 24 in the same metal layer. The spacing between solid metal patterns 50 follows design rules. As a result, for some of bump pads 38 that do not have metal lines 24 directly under it, the respective underlying solid metal patterns 50 fully overlap the bump pads 38. Solid metal patterns 50 may be inserted throughout an entirety of metal layer Mi so that existing metal lines 24 and solid metal patterns 50 substantially extend throughout metal layer Mi.

Next, as shown in FIG. 4, portions of solid metal patterns 50 are removed, forming rectangular openings 54. The remaining portions of solid metal patterns 50 are referred to as being dummy metal patterns 52 hereinafter. In the resulting structure, some of dummy patterns 52 outside directly-under-bump-pad regions 46 may be interconnected, with rectangular openings 54 therein, which openings 54 will be filled with dielectric materials 31 or 32 (FIG. 1) in the manufacturing of the respective semiconductor wafer. During the removal, the portions of solid metal patterns 50 in directly-under-bump-pad regions 46 and the portions of solid metal patterns 50 outside directly-under-bump-pad regions 46 are treated differently. In an embodiment, in directly-under-bump-pad regions 46, no portion of solid metal patterns 50 is removed. Outside directly-under-bump-pad regions 46, however, portions of solid metal patterns 50 are removed.

In alternative embodiments, portions of solid metal patterns 50 in directly-under-bump-pad regions 46 are also removed along with the portions of solid metal patterns 50 outside the directly-under-bump-pad regions 46. However, in directly-under-bump-pad regions 46, a smaller percentage may be removed compared to the regions outside directly-under-bump-pad regions 46. In a resulting layout, assuming in directly-under-bump-pad regions 46, the metal pattern density is "A," and outside of directly-under-bump-pad regions 46, the metal pattern density is "B," metal pattern density A (including both metal lines 24 and dummy patterns 52) is higher than metal pattern density B (also including both metal lines 24 and dummy patterns 52). The value of A may be greater than value B by a difference greater than about 10 percent, or greater than about 90 percent. It is noted that metal pattern density A is measured for an entire directly-under-bump-pad region 46 under each bump pad 38, and metal pattern density B is measured for an chip area equal to or greater than a 100 µm×100 µm. Furthermore, metal pattern density A may be higher than about 90 percent, or may be as high as 100 percent. Outside directly-under-bump-pad regions 46, metal pattern density B may be between about 10 percent and about 85 percent.

Figure 5:
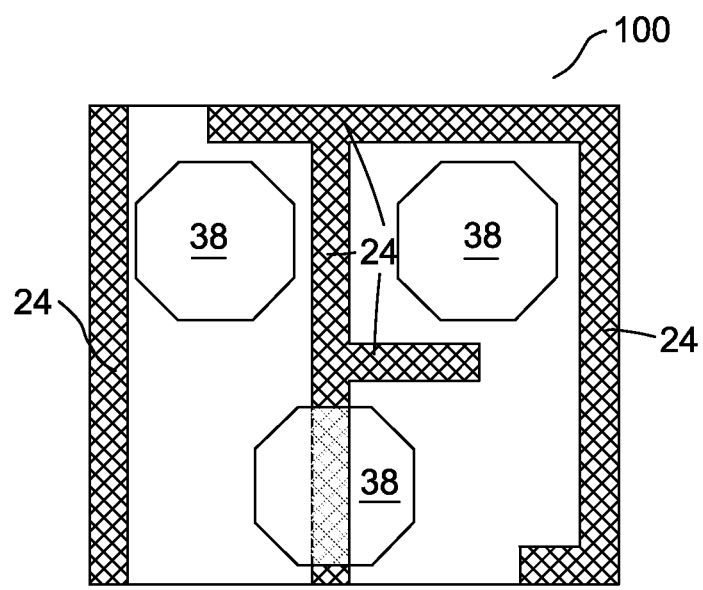
FIGS. 5 through 7 are top views of intermediate stages in the insertion of dummy metal patterns in accordance with an alternative embodiment, wherein dummy metal patterns are inserted into the directly-under-bump-pad regions, and then additional dummy metal patterns are inserted outside the directly-under-bump-pad regions.
Figure 6:
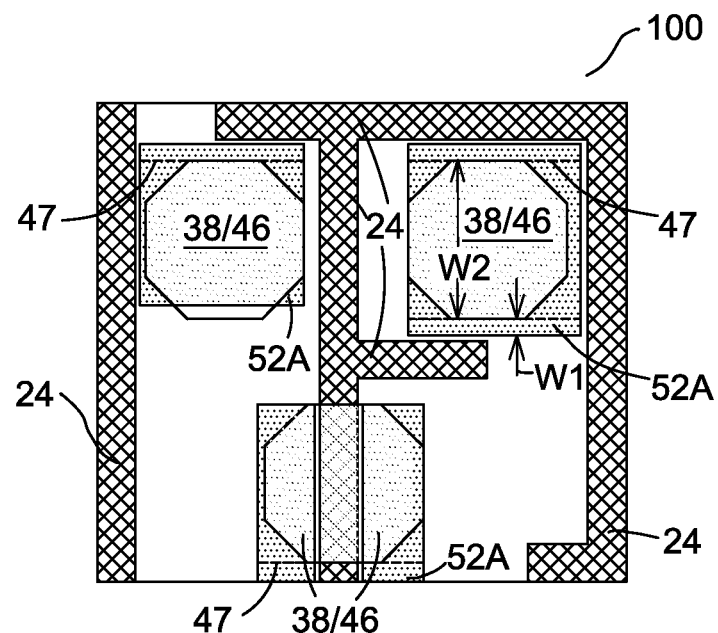
Figure 7:
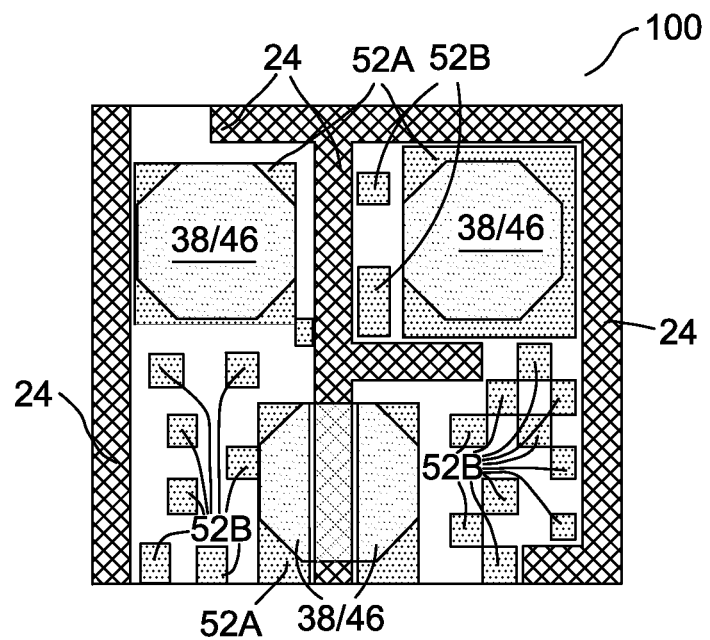

FIGS. 5 through 7 illustrate top views in the intermediate stages in laying out dummy patterns in accordance with an alternative embodiment. Unless specified otherwise, the reference numerals in this embodiment are essentially the same as in the embodiment shown in FIGS. 2 through 4. As shown in FIG. 5, metal lines 24 are laid out first. Next, referring to FIG. 6, dummy patterns 52A are added to the same metal layer as metal lines 24. Throughout the description, dummy patterns 52A are alternatively referred to as being solid dummy patterns due since their sizes are close to or greater than the sizes of bumps pads 38, and also since they are implemented in semiconductor chips. Further, in this step, dummy patterns 52A are added into directly-under-bump-pad regions 46, while outside of directly-under-bump-pad regions 46, no dummy patterns 52A or substantially no dummy patterns 52A are added. Although edges of dummy patterns 52A are shown as slightly extend beyond the edges of bump pads 38, they may also be aligned to the edges of bump pads 38, as shown by dotted lines 47. Dummy patterns 52A may substantially overlap an entirety of the respective bump pads 38, and may also extend slightly beyond edges of the respective bump pads 38. However, the extension of dummy patterns 52A beyond bump pads 38 is limited. For example, the extension width W1 is smaller than about 20 percent width W2 of bump pads 38. Dummy patterns 52A may also have substantially the same shape and the same size as the respective overlying bump pads 38, and may substantially fully overlap the respective overlying bump pads 38. In an embodiment, dummy patterns 52A are not solid metal patterns, and may include a plurality of disconnected portions under a same bump pad 38. The metal pattern density A in the directly-under-bump-pad regions 46 may reach about 90 percent or greater. Furthermore, in the embodiments wherein metal lines 24 extend into the directly-under-bump-pad regions 46, dummy metal pads 52A will be spaced apart from metal lines 24.

Next, as shown in FIG. 7, dummy patterns 52B are added to the same metal layer as metal lines 24 and outside directly-under-bump-pad regions 46. In this step, substantially no dummy pattern is inserted into directly-under-bump-pad regions 46. Dummy patterns 52B may form discrete rectangular patterns, or may have other shapes. As a result, metal pattern density B outside the directly-under-bump-pad regions 46 may fall into a pre-determined range, for example, between about 15 percent and about 85 percent in chip areas equal to or greater than a 100 µm×100 µm.

In an embodiment, the procedure in FIGS. 2 through 4 or the procedure in FIGS. 5 through 7 may be repeated for upper metal layers such as Mtop and Mtop-1, but not to the lower metal layers such as M1 through Mtop-2. In alternative embodiments, the procedure in FIGS. 2 through 4 or the procedure in FIGS. 5 through 7 may be repeated for each of metal layers M1 through Mtop. By increasing the metal pattern density in directly-under-bump-pad regions 46, the stress applied to bump pads 38 may be distributed more uniformly throughout the respective wafer, so that the reliability of the resulting package assembly is improved. Furthermore, with a maximum pattern density in directly-under-bump-pad regions 46, the heat dissipation is also improved.

Figure 8:
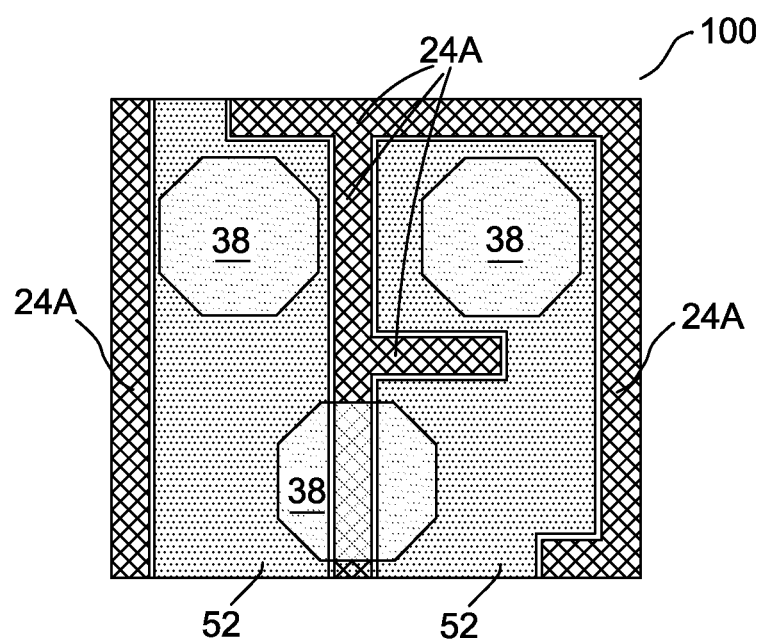
FIGS. 8 through 13 are top views of intermediate stages in the insertion of dummy vias in the directly-under-bump-pad regions.

FIGS. 8 through 13 illustrate the intermediate stages in the insertion of dummy vias in accordance with an alternative embodiment. Referring to FIG. 8, solid metal patterns 52 are added throughout one of metal layers, which may be any of metal layers M2 through Mtop and is referred to as metal layer Mi hereinafter. Integer i hence may be any value between and including 2 and "top." The details for inserting solid metal patterns 52 may be essentially the same as shown in FIGS. 2 and 3, and hence are not repeated. The metal connections/lines in metal layer Mi are denoted as 24A, which are laid out before the insertion of solid metal patterns 52. Solid metal patterns 52 are disconnected from any of metal lines 24A.

Figure 9:
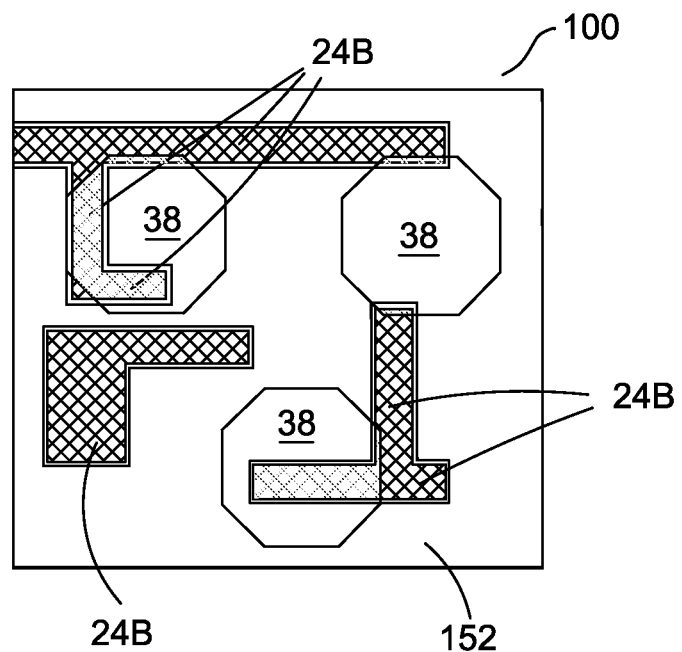

Next, as shown in FIG. 9, solid metal pattern(s) 152 are inserted into metal layer M(i−1), which is the metal layer immediately under metal layer Mi, with no other metal layer located between metal layers Mi and M(i−1). The details for inserting solid metal pattern 152 are essentially the same as the insertion of solid metal pattern 52, and hence are not discussed herein. Metal layer M(i−1) may also have metal lines 24 (denoted as 24B) that were pre-laid out, which may have a different pattern than metal lines 24A shown in FIG. 8.

Figure 10:
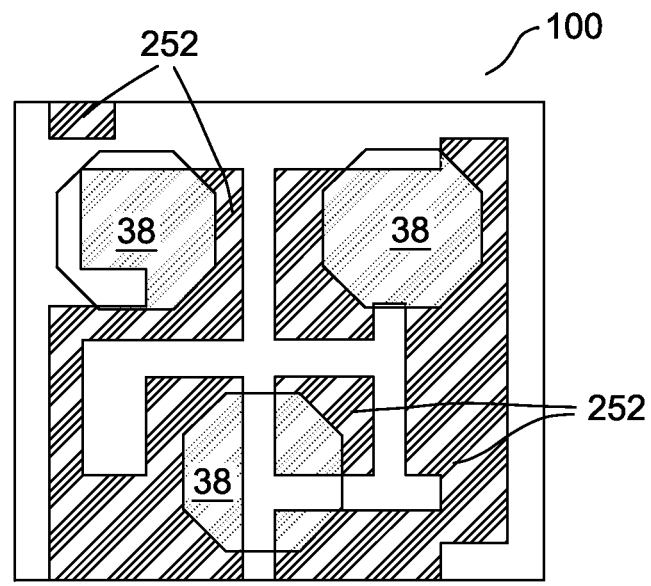

FIG. 10 illustrates the overlay regions of solid metal patterns 52 and solid metal patterns 152, wherein overlay regions 252 are where solid metal patterns 52 and 152 overlap each other in the top view. In other words, both solid metal pattern 52 and 152 extend into overlay regions 252.

Figure 11:
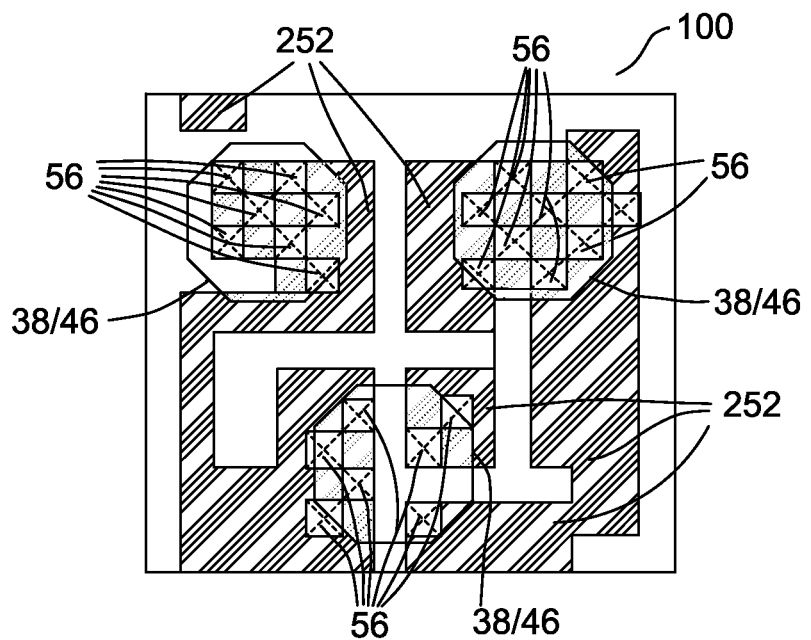

Referring to FIG. 11, dummy vias 56 are inserted between metal layers Mi and M(i31 1) to interconnect solid metal patterns 52 and 152. Dummy via 56 overlap overlay regions 252 in the top view. At least a portion of, and may be an entirety of, each of dummy vias 56 is located in directly-under-bump-pad regions 46. Accordingly, at least a portion of each of dummy vias 56 substantially vertically overlaps bump pads 38. Outside of directly-under-bump-pad regions 46, substantially no dummy vias 56 are inserted. When dummy vias 56 and metal layers Mi and M(i−1) are implemented in semiconductor wafers, dummy vias physically connect dummy patterns 52 to dummy patterns 152 (Please refer to FIGS. 12 and 13). In an embodiment, in the via layer between metal layers Mi and M(i−1), no additional dummy vias besides dummy vias 56 are inserted in any step before and after the insertion of dummy vias 56. No additional dummy vias besides dummy vias 56 are inserted in any step between the insertion of dummy vias 56 and the manufacturing of the respective wafers including dummy vias 56. Accordingly, no additional dummy vias besides dummy vias 56 are formed in the respective physical wafers.

Figure 12:
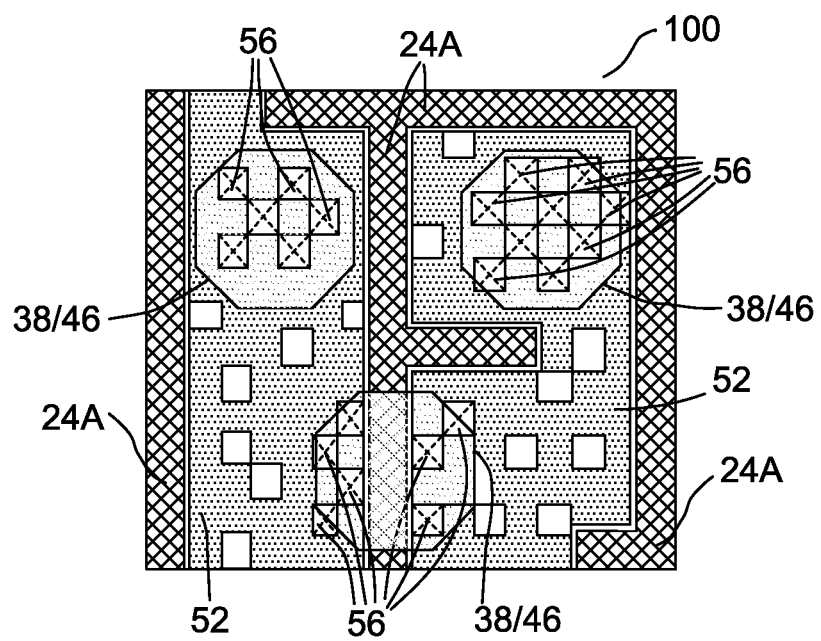
Figure 13:
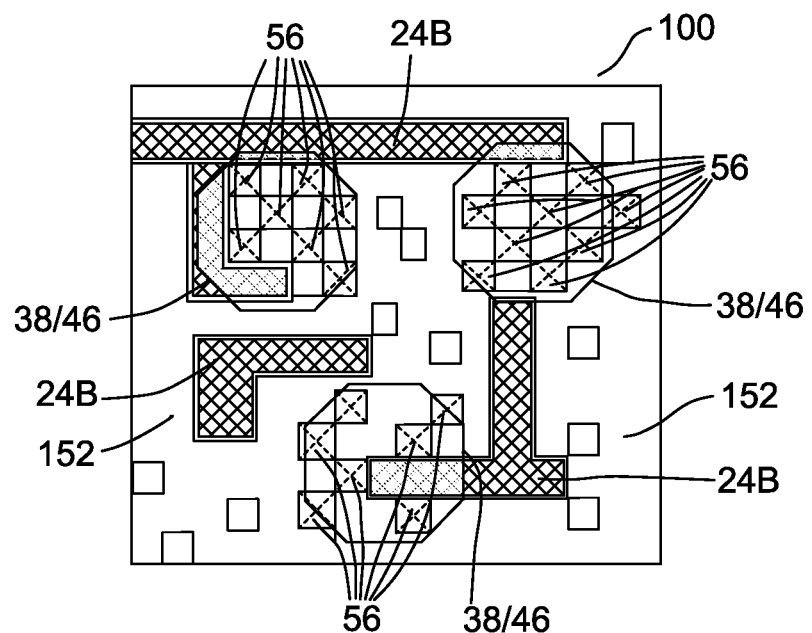
Figure 14:
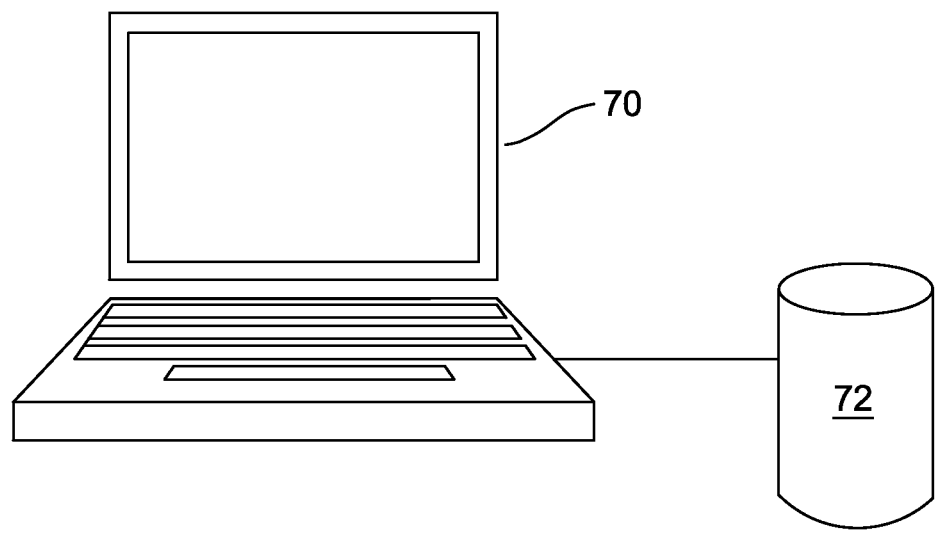
FIG. 14 illustrates a computer for performing the layout of metal patterns and a storage media for storing the layouts of the dummy patterns.

Next, as shown in FIG. 12, portions of solid metal pattern 52 are removed from metal layer Mi and from outside of directly-under-bump-pad regions 46. FIG. 13 illustrates that portions of solid metal patterns 152 are removed from metal layer M(i−1) and from outside directly-under-bump-pad regions 46. The details for removing portions of solid metal patterns 52 and 252 may be essentially the same as shown and discussed for FIG. 4, and hence are not repeated herein. Similar to the embodiment shown in FIG. 4, substantially no portions of solid metal patterns 52 and 152 are removed from directly-under-bump-pad regions 46. The remaining portions of solid metal patterns 52 and 152 are dummy metals.

By using the process shown in FIGS. 8 through 13, the metal pattern densities in metal layer(s) M1 through Mtop and the via layers are increased without causing the increase in the metal pattern density outside the directly-under-bump-pad regions 46.

FIGS. 2 through 13 illustrate the layout of dummy metal lines, wherein the layout may be implemented using a computer 70, which includes specific software for performing the steps as shown in FIGS. 2 through 13. The resulting layouts are saved in a storage media such as hard drives 72. The resulting dummy metal lines, dummy vias 56 and bump pads 38 as shown in FIGS. 2 through 13 may be implemented (manufactured) in physical semiconductor wafer 100, resulting in the structure shown in FIG. 1.

In accordance with embodiments, a method includes providing a wafer representation including a metal layer and a plurality of bump pads over the metal layer, wherein the metal layer includes directly-under-bump-pad regions. A solid metal pattern is inserted into the metal layer, wherein the solid metal pattern includes first parts in the directly-under-bump-pad regions and second parts outside the directly-under-bump-pad regions. Portions of the second parts of the solid metal pattern are removed, wherein substantially no portions of the first parts of the solid metal pattern are removed. The remaining portions of the solid metal pattern not removed during the step of removing form dummy metal patterns. The dummy metal patterns and the plurality of bump pads are implemented in a semiconductor wafer.

In accordance with other embodiments, a method includes providing a wafer representation including a first metal layer, a second metal layer over the first metal layer, and a plurality of bump pads over the second metal layer, wherein the first and the second metal layers include first and second directly-under-bump-pad regions, respectively. A first solid metal pattern is inserted into the first metal layer, wherein the first solid metal pattern includes first parts in the first directly-under-bump-pad regions and second parts outside the first directly-under-bump-pad regions. A second solid metal pattern is inserted into the second metal layer, wherein the second solid metal pattern includes third parts in the second directly-under-bump-pad regions and fourth parts outside the second directly-under-bump-pad regions. Portions of the second parts and the fourth parts of the first and the second solid metal patterns, respectively, are removed, wherein substantially no portions of the first parts of the first solid metal pattern and the third parts of the second solid metal pattern are removed. The remaining portions of the first and the second solid metal patterns not removed during the step of removing form dummy metal patterns. Dummy vias are inserted between the first and the second metal layers, wherein the dummy vias are between and vertically overlap the first parts and the third parts. The dummy metal patterns and the plurality of bump pads are implemented in a semiconductor wafer.

In accordance with yet other embodiments, a method includes providing a wafer representation including a metal layer and a plurality of bump pads over the metal layer, wherein the metal layer includes directly-under-bump-pad regions. A solid dummy metal pattern is inserted into the metal layer, wherein the solid dummy metal pattern is substantially limited in the directly-under-bump-pad regions, and wherein substantially no solid dummy metal pattern is inserted outside the directly-under-bump-pad regions. After the step of inserting the solid dummy metal pattern, dummy patterns are inserted into the metal layer and outside the directly-under-bump-pad regions. The solid dummy metal pattern and the dummy patterns are implemented in a semiconductor wafer.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
providing a wafer representation comprising a metal layer and a plurality of bump pads over the metal layer, wherein the metal layer comprises directly-under-bump-pad regions;
inserting a solid metal pattern into the metal layer, wherein the solid metal pattern extends inside the directly-under-bump-pad regions and outside the directly-under-bump-pad regions; and
forming dummy metal patterns by removing portions of the solid metal pattern outside the directly-under-bump-pad regions, wherein substantially no portions of the solid metal pattern inside the directly-under-bump-pad regions are removed, and wherein the steps of inserting and removing are performed using a computer.

2. The method of claim 1 further comprising implementing the dummy metal patterns and the plurality of bump pads in a semiconductor wafer.

3. The method of claim 1, wherein the solid metal pattern vertically overlaps an entirety of one of the plurality of bump pads.

4. The method of claim 1, wherein the metal layer is immediately underlying the plurality of bump pads, with no additional metal layer between the metal layer and the plurality of bump pads.

5. The method of claim 1, wherein the metal layer is not immediately underlying the plurality of bump pads, with at least one additional metal layer between the metal layer and the plurality of bump pads.

6. The method of claim 1, wherein throughout an entirety of the wafer representation, substantially no portion of the solid metal pattern is removed from any directly-under-bump-pad region under any of the plurality of bump pads.

7. The method of claim 1, wherein a metal density in the directly-under-bump-pad regions is greater than about 90 percent, and a metal density of the metal layer outside the directly-under-bump-pad regions and in a region having a size greater than about 100 μm×100 μm is between about 15 percent and about 85 percent.

8. The method of claim 1, wherein before the step of inserting the solid metal pattern, metal connections exist in the metal layer, and wherein the solid metal pattern is disconnected from any of the metal connections.

9. The method of claim 8, wherein during the step of inserting the solid metal pattern, additional solid metal patterns are inserted to fill the metal layer, and wherein none of the additional solid metal patterns connects to any metal connection in the metal layer.

10. The method of claim 1 further comprising an additional insertion step, wherein during the additional insertion step, dummy vias are inserted into the directly-under-bump-pad regions, and wherein no dummy vias are inserted outside the directly-under-bump-pad regions.

11. A method comprising:
providing a wafer representation comprising a first metal layer, a second metal layer over the first metal layer, and a plurality of bump pads over the second metal layer, wherein the first and the second metal layers comprise first and second directly-under-bump-pad regions, respectively;
inserting a first solid metal pattern into the first metal layer, wherein the first solid metal pattern extends inside the first directly-under-bump-pad regions and outside the first directly-under-bump-pad regions;
inserting a second solid metal pattern into the second metal layer, wherein the second solid metal pattern extends inside the second directly-under-bump-pad regions and outside the second directly-under-bump-pad regions;
forming dummy metal patterns by removing portions of the first and the second solid metal patterns outside the first and the second directly-under-bump-pad regions, respectively, wherein substantially no portions of the first solid metal pattern inside the first directly-under-bump-pad regions and the second solid metal pattern inside the second directly-under-bump-pad regions are removed; and
inserting dummy vias between the first and the second metal layers, wherein the dummy vias are between and vertically overlap the the portions of the first and the second solid metal patterns inside the first and the second directly-under-bump-pad regions, wherein the steps of inserting the first and the second solid metal patterns, forming dummy metal patterns, and inserting the dummy vias are performed using a computer.

12. The method of claim 11, wherein between the step of forming dummy metal patterns and a step of implementing the dummy metal patterns in a chip, substantially no additional dummy vias are inserted to a same level as the dummy vias and outside the first and the second directly-under-bump-pad regions.

13. The method of claim 11, wherein throughout the wafer representation, substantially no portion of the first and the second solid metal patterns is removed from any of the portions of the first and the second solid metal pattern inside the first and the second directly-under-bump-pad regions, respectively.

14. The method of claim 11, wherein metal densities in the first and the second directly-under-bump-pad regions are greater than about 90 percent, and wherein metal densities in regions of the first and the second metal layers outside the respective first and the second directly-under-bump-pad regions are between about 15 percent and about 85 percent.

15. The method of claim 11, wherein before the steps of inserting the first and the second solid metal patterns, metal connections exist in the first or second metal layers, and wherein the first and the second solid metal patterns are electrically disconnected from any of the metal connections.

16. The method of claim 11, wherein during the steps of inserting the second solid metal pattern, additional solid metal patterns are inserted into substantially all directly-under-bump-pad regions of all bumps pads in the wafer representation, and wherein the additional solid metal patterns are inserted into the second metal layer.

17. A method comprising:
providing a wafer representation comprising a metal layer and a plurality of bump pads over the metal layer, wherein the metal layer comprises directly-under-bump-pad regions;
inserting a solid dummy metal pattern into the metal layer, wherein the solid dummy metal pattern is substantially limited in the directly-under-bump-pad regions, and wherein substantially no solid dummy metal pattern is inserted outside the directly-under-bump-pad regions;
after the step of inserting the solid dummy metal pattern, inserting dummy patterns into the metal layer and outside the directly-under-bump-pad regions;
performing the steps of inserting a solid dummy metal pattern and inserting dummy patterns on a computer; and
implementing the solid dummy metal pattern and the dummy patterns in a semiconductor wafer.

18. The method of claim 17, wherein the solid dummy metal pattern vertically overlaps an entirety of one of the plurality of bump pads.

19. The method of claim 17, wherein before the step of inserting the solid dummy metal pattern, a metal connection exists in one of the directly-under-bump-pad regions, wherein the solid dummy metal pattern and the metal connection vertically overlap substantially an entirety of the one of the plurality of bump pads, and wherein the solid dummy metal pattern is disconnected from the metal connection.

20. The method of claim 17, wherein metal densities in substantially all of the directly-under-bump-pad regions throughout the wafer representation are greater than about 90 percent, and metal densities in a region of the metal layer outside of the directly-under-bump-pad regions is between 15 percent and 85 percent, with the region having a size greater than about 100 μm×100 μm.

* * * * *